United States Patent
Brinke-Seiferth

(10) Patent No.: US 11,701,618 B2
(45) Date of Patent: Jul. 18, 2023

(54) METAL COATED POLYMEMBRANE

(71) Applicant: i3 Membrane GmbH, Hamburg (DE)

(72) Inventor: Stephan Brinke-Seiferth, Hamburg (DE)

(73) Assignee: I3 MEMBRANE GMBH, Hamburg (DE)

( * ) Notice: Subject to any disclaimer, the term of this patent is extended or adjusted under 35 U.S.C. 154(b) by 581 days.

(21) Appl. No.: 16/869,052

(22) Filed: May 7, 2020

(65) Prior Publication Data

US 2020/0261852 A1 Aug. 20, 2020

Related U.S. Application Data

(62) Division of application No. 15/202,916, filed on Jul. 6, 2016, now Pat. No. 10,682,612.

(30) Foreign Application Priority Data

Jul. 7, 2015 (EP) .................................... 15175700

(51) Int. Cl.
 *B01D 61/42* (2006.01)
 *C23C 16/455* (2006.01)
 (Continued)

(52) U.S. Cl.
 CPC ....... *B01D 61/425* (2013.01); *B01D 67/0072* (2013.01); *B01D 67/0088* (2013.01);
 (Continued)

(58) Field of Classification Search
 CPC .............................................. C02F 1/001–004
 See application file for complete search history.

(56) References Cited

U.S. PATENT DOCUMENTS 2,435,627 A * 2/1948 Grandin ................. B01D 29/03
 210/287
4,720,400 A 1/1988 Manniso
(Continued)

FOREIGN PATENT DOCUMENTS

CH 678403 9/1991
CN 1172774 2/1998
(Continued)

OTHER PUBLICATIONS

Spietelun Agata, et al.: "Recent developments and future trends in solid phase microextration techniques towards green analytical chemistry", Journal of Chromatography A, vol. 1321, Oct. 17, 2013 (Oct. 17, 2013), pp. 1-13, XP028785488, ISSN: 0021-9673, SOI: 10.2016/J. Chroma. Oct. 30, 2017 apge 5, right-hand column, last paragraph—p. 6, right-hand column, paragraph 1.
(Continued)

*Primary Examiner* — Salil Jain
(74) *Attorney, Agent, or Firm* — Sand, Sebolt & Wernow Co., LPA

(57) ABSTRACT

A metal coated polymer membrane, a method for the production thereof, an electrofiltration device, or an electrosorption device, and a method of electrofiltration and electrosorption using a metal coated polymer membrane. The polymer membrane is coated with metal using Atomic Layer Deposition (ALD).

8 Claims, 1 Drawing Sheet

(51) Int. Cl.
*C23C 16/04* (2006.01)
*B01D 67/00* (2006.01)
*B01D 71/68* (2006.01)
*C02F 1/469* (2023.01)
*B01D 71/02* (2006.01)
*C23C 16/06* (2006.01)
*C23C 16/40* (2006.01)
*C02F 103/34* (2006.01)
*C02F 1/44* (2023.01)
*C02F 1/461* (2023.01)
*C02F 101/30* (2006.01)

(52) U.S. Cl.
CPC .......... *B01D 71/022* (2013.01); *B01D 71/68* (2013.01); *C02F 1/469* (2013.01); *C23C 16/045* (2013.01); *C23C 16/06* (2013.01); *C23C 16/403* (2013.01); *C23C 16/45525* (2013.01); *C23C 16/45555* (2013.01); *B01D 2311/2684* (2013.01); *B01D 2313/345* (2013.01); *B01D 2323/28* (2013.01); *B01D 2323/283* (2013.01); *C02F 1/444* (2013.01); *C02F 2001/46138* (2013.01); *C02F 2001/46161* (2013.01); *C02F 2101/30* (2013.01); *C02F 2103/343* (2013.01); *C02F 2201/4613* (2013.01); *C02F 2303/16* (2013.01)

(56) References Cited

U.S. PATENT DOCUMENTS

| | | | |
|---|---|---|---|
| 4,857,080 | A | 8/1989 | Baker et al. |
| 5,282,971 | A | 2/1994 | Degen et al. |
| 5,759,412 | A * | 6/1998 | McDougald ....... B01D 24/4636 210/275 |
| 7,132,049 | B2 | 11/2006 | Hou et al. |
| 7,396,465 | B2 | 7/2008 | Wu et al. |
| 2008/0145400 | A1 | 6/2008 | Weber et al. |
| 2010/0055795 | A1 | 3/2010 | Lee |
| 2012/0171376 | A1 | 7/2012 | Dogde |
| 2013/0240361 | A1 | 9/2013 | Simonis |
| 2014/0076728 | A1 * | 3/2014 | Prakash ................ B01D 61/22 204/627 |
| 2016/0166960 | A1 | 6/2016 | Choi et al. |

FOREIGN PATENT DOCUMENTS

| | | |
|---|---|---|
| CN | 1780793 | 5/2006 |
| CN | 101232931 | 7/2008 |
| CN | 102423645 | 4/2012 |
| CN | 102773026 | 11/2012 |
| CN | 104211138 | 12/2014 |
| DE | 1912850 | 1/1970 |
| DE | 3120086 | 9/1982 |
| DE | 19812850 | 10/1991 |
| DE | 19810947 | 9/1999 |
| DE | 10013457 | 9/2001 |
| DE | 10164214 | 7/2003 |
| DE | 69727310 | 11/2004 |
| DE | 102011012832 | 4/2012 |
| DE | 102016125818 | 6/2018 |
| EP | 0380266 | 8/1990 |
| EP | 0872278 | 10/1996 |
| EP | 0860888 | 8/1998 |
| EP | 0872278 | 10/1998 |
| EP | 1323463 | 7/2003 |
| EP | 2428262 | 3/2012 |
| JP | H01-301879 | 6/1989 |
| JP | H02-245209 | 1/1990 |
| JP | H03-47519 | 2/1991 |
| JP | H06-55011 | 3/1994 |
| WO | 1999/022843 | 5/1999 |
| WO | 1999022843 | 5/1999 |
| WO | 00/50161 | 8/2000 |
| WO | 2002051874 | 7/2002 |
| WO | 2004/015161 | 2/2004 |
| WO | 2004096715 | 11/2004 |
| WO | 2007/149606 | 12/2007 |
| WO | 2008057991 | 5/2008 |
| WO | 2011057341 | 5/2011 |
| WO | 2018122315 | 7/2018 |

OTHER PUBLICATIONS

Loh I-H, et al.: "Electrically Conductive Membranes: Sysnthesis and Applications", Journal of Membrane Socience, Elsevier BV, NL, vol. 50, No. 1, May 1, 1990 (May 1, 1990), pp. 31-49, XP000159695, ISSN: 0376-7388, DOI: 10.2016/S0376-7388(00)80884-4 the whole document.

Analyte Loss Due to Membrane Filter Adsoption as Determined by High-Performance Ligquid Chomatography; M. Carlson and R.D. Thompson; Journal of Chromatographic Science, vol. 38, Feb. 2000.

Removal of Arsenic and Humic Substances (HSs) by Electro-Ultrafiltration (EURf); Weng, Y.-H, et al., Chem Eng. R&D, vol. 77, Jul. 1999, pp. 461-468.

"Analyte Loss Due to Membrane Filter Adsoption as Determined by High-Performance Liquid Chromatography." M. Carlson and R.D. Thompson, Journal of Chromatographic Science, vol. 38, Feb. 2000.

"Removal of Arsenic and Humic Substances (HSs) by Electro-Ultrafiltration (EUF)." Weng, Y.H. et al., Journal of Hazardous Materials B122 (2005), pp. 171-176, Apr. 22, 2005.

* cited by examiner

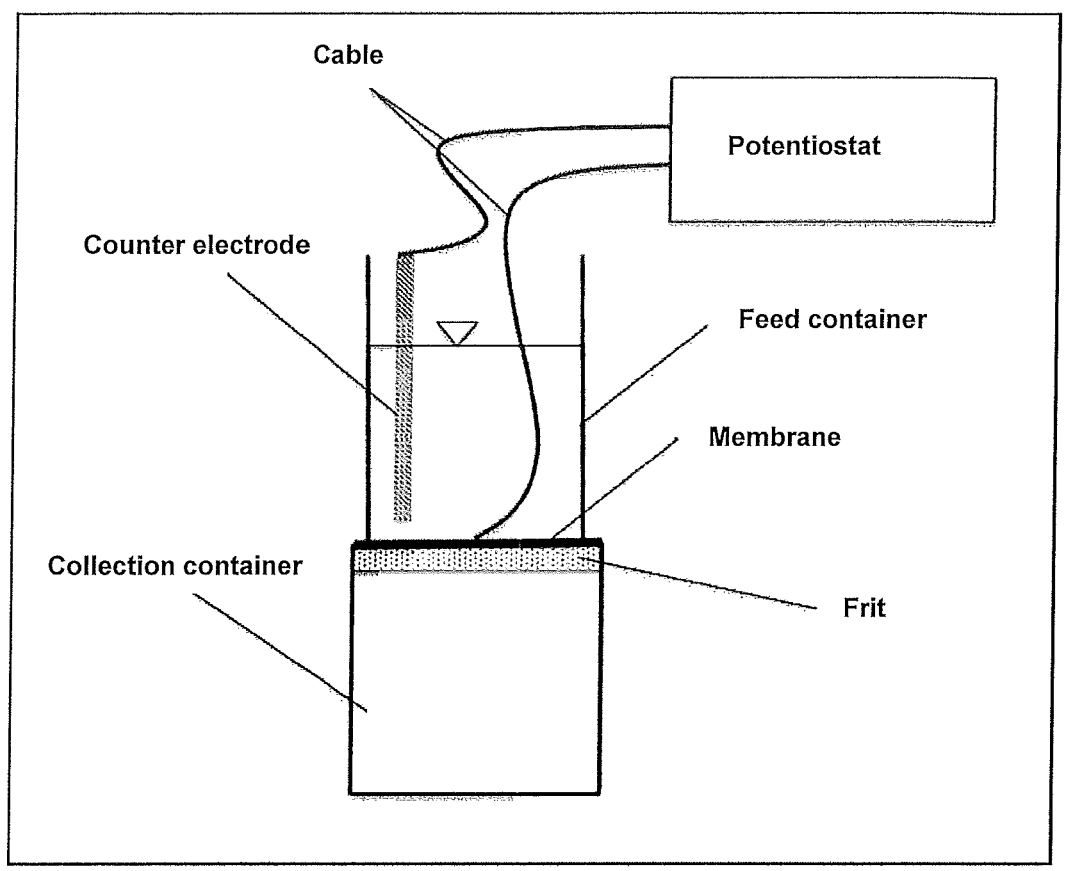

METAL COATED POLYMEMBRANE

CROSS-REFERENCE TO RELATED APPLICATIONS

This is a divisional of U.S. patent application Ser. No. 15/202,916, filed Jul. 6, 2016, the entire disclosure of which is incorporated herein by reference.

U.S. patent application Ser. No. 15/202,916 claims priority from European Patent Application Serial No. EP15175700.2, filed Jul. 7, 2015.

BACKGROUND

Technical Field

The present invention relates to a metal coated polymer membrane, a method for the production thereof, an electrofiltration or electrosorption device, as well as a method of electrofiltration and electrosorption using a metal coated polymer membrane.

Background Information

Microporous membranes have long been known. These are manufactured primarily from polymers and used both for water treatment (waste water, drinking water, industrial water) as well as in the pharmaceutical industry for producing ultra-pure water, as well as in medical technology as sterile filters or breathing filters. The fields of application are manifold and very divergent. Microporous membranes generally have a pore size between 0.01 µm and 10 µm and retain substances corresponding to these pore sizes.

Microporous filters are typically used to separate substances dissolved in water and to obtain a clear filtrate. This generally occurs mechanically via the pore size. All substances that are larger than the size of the pores are mechanically retained. In addition to this property, there is still another mechanism that takes place to retain substances when passing through the membrane. This involves a non-defined adsorption by the materials of which the membrane itself is comprised such as, for example, polyethersulfone, polypropylene, or polyvinylidene fluoride (PVDF). In this case, different materials adsorb diverse dissolved substances to various degrees ("Analyte Loss Due to Membrane Filter Adsorption as Determined by High-Performance Liquid Chromatography", M. Carlson and R. D. Thompson, Journal of Chromatographic Science, Vol. 38, February. 2000).

A directed adsorption of substances that are smaller than the pore size of the microporous membrane, through the material properties of the membrane material, is achieved by the chemical treatment of the composition of the membrane material. A positive charge is generated, for example, by bonding the membrane material with positively charged quaternary ammonia compounds. Positively charged membranes are known from U.S. Pat. No. 5,282,971 or from U.S. Pat. No. 7,396,465 B2, negatively charged membranes from U.S. Pat. No. 7,132,049 B2. For example, positively charged microporous membranes are used to mechanically retain bacteria and to allow positively charged substances to pass, in order to avoid an undirected, unquantifiable adsorption by the membrane material. However, positively and also negatively charged membranes are also used to bind and concentrate proteins by adsorption. In addition to filtration, positively charged microporous membranes are also used to bind endotoxins and viruses via adsorption as described, for example, in DE 19810947A1.

A membrane coated with metal having potentially slightly porous passages between macropores on one side and micropores on the metallic side is known from CH 678403. Metallic membranes having tunnel-like passages are also known, for example, from DE 101 64 214 A1. These differ from porous passages as worded in the application, as they are known, for example, from porous polymer membranes, in that they form no cavities outside the actual passage channel within the membrane. Thus, porous cannot be equated with the statement that the membrane has pores, i.e., passages as in DE 101 64 214 A1, for example. Porous passages, therefore, have a surface within the membrane, which clearly surpasses the surface of a round tunnel having the same pore size through an equally thick membrane, at least by 50%, in particular, by a multiple, in particular, at least by three-fold.

Moreover, it is also known from WO1999/22843 A1 to sputter-coat a polymer membrane with metal.

It is also known from U.S. Pat. No. 4,857,080 to seal a membrane with a metal coating.

Another form of adsorption is electrosorption. Electrosorption occurs by producing an electrically charged field on surfaces by applying a positive and negative voltage at two electrodes. A combination of electrosorption and ultraporous filtration is described in "Removal of arsenic and humic substances (HSs) by electro-ultrafiltration (EUF)", (Weng, Y. H. et al., Chem. Eng. R&D Vol. 77, July 1999, pages 461-468). In this instance, an adsorption increase of negatively charged arsenic (V) from 30% to 90% during the filtration of water loaded with arsenic by way of an ultrafiltration is achieved by producing an electrical field through an external electrode, which is positioned close to an ultrafiltration membrane. A similar use of electrosorption in combination with membranes is described in US2013/0240361 A1. The purification of dialysis water is described in a combination of substances having strongly adsorptive properties and the regeneration thereof by electrical charging. The method is carried out in combination with a dialysis membrane filter.

An electrosorption membrane is described in EP0872278A1. Here, a ceramic membrane having a conductive layer made of pyrolytic carbon is provided. In this membrane, the pores are sealed with pyrolytic carbon and the ceramic surface is then rendered conductive by converting the ceramic surface to carbide at high temperature. With this ceramic membrane, salts were adsorptively bonded to the surface via electrosorption.

In addition to the advantages of membranes charged positively or negatively through chemical treatment, namely the combination of mechanical filtration and adsorption, the former also have disadvantages. Since the charging cannot be varied, the substances that have been adsorptively bonded can, after loading of the membrane, be removed or extracted from the membrane again only by a displacement of the load by a passing solution, generally by a change in pH value. This represents added complexity, in particular, when extracting active ingredients through concentration such as, for example, proteins.

A possible electrosorption at the conductive surface of a ceramic membrane permits a more flexible sorption of substances, but is very complex to produce. In this case, the pores of the membrane are sealed within the process for producing the conductive surface in order to provide the ceramic surface with a conductive carbide layer in a subsequent production step by means of very high temperatures.

SUMMARY

The object is to specify a method for simply producing a polymer membrane with a metal coating, which is suitable for use in electrofiltration and/or electrosorption, without significantly reducing the porosity and, therefore, the filtration properties of the membrane, or without sealing the pores in the process.

The object is also to specify a method for simply producing a very resistant, biocidic, and/or inert membrane on the basis of a polymer membrane.

The object is also to specify a more effective device and a more effective method for electrofiltration and/or electrosorption.

BRIEF DESCRIPTION OF THE DRAWINGS

FIG. 1 shows a merely exemplary electrofiltration device according to the invention and with which device it is possible to carry out the electrofiltration method according to the invention.

DETAILED DESCRIPTION

The objects are achieved by a method of electrosorption and/or electrofiltration comprising the following steps: a. providing a polymer membrane with an areal and porous metal coating at least on a first side of the polymer membrane; b. providing a counter electrode; c. arranging the polymer membrane and the counter electrode in a container for receiving liquid; d. pouring liquid into the container; e. applying a voltage between the metal coating of the polymer membrane and the counter electrode; f. at least partially removing the liquid from the container or letting it pass at least partially through the membrane; and g. reversing the polarity of the voltage; and by an electrofiltration device and/or electrosorption device including a polymer membrane with an areal and porous metal coating on at least one side of the polymer membrane and a contacting of the metal coating and a counter electrode and, in particular, an additional electrode, a metal coated polymer membrane comprising porous passages, wherein the metal and/or aluminum oxide coated polymer membrane has an interior polymer membrane with porous passages and a metal and/or aluminum oxide coating, characterized in that the polymer membrane is completely encapsulated by the metal and/or aluminum oxide coating, and that the metal and/or aluminum oxide coating has a thickness of 1 nm to 50 nm; and a method for producing a polymer membrane with a metal coating comprising the steps: a. providing a polymer membrane b. coating the polymer membrane using the ALD method, wherein the temperature of the polymer membrane, in particular, does not rise above 200° C.; wherein the coating is applied at least areally on the surface of all surfaces of the polymer membrane accessible from one side of the polymer membrane to gas, and the layer thickness of the aluminum oxide and/or metal coating of the polymer membrane is between 1% and 45% with respect to the initial bubble point pore and/or the average pore size of the uncoated polymer membrane. Advantageous refinements include wherein the counter electrode is formed either by an additional areal porous metal coating on a second side situated opposite the first side, wherein the areal metal coatings are insulated from one another by the polymer membrane, or by a permeable electrode, formed, in particular by a metallic net, wherein an insulating and permeable spacer is interposed; wherein the porosity of the polymer membrane with the metal coating is reduced between 1% and 50%, in particular, 1% and 20% with respect to the initial bubble point pore and/or the average pore size, compared to the uncoated polymer membrane; and wherein the thickness of the metal coating is 5 nm to 50 nm and the pore size of the uncoated polymer membrane is, in particular, greater than 0.01 μm. Further advantageous refinements include that the coating and, in particular, the polymer membrane with the coating, is inert and/or biocidic; and wherein the porosity of the polymer membrane with a metal coating is reduced between 1% and 50%, in particular, 1% and 20% with respect to the initial bubble point pore and/or the average pore size, compared to the uncoated polymer membrane. Still further advantageous refinements include a method wherein metal and/or aluminum oxide are deposited until the layer thickness of the metal and/or aluminum oxide coating of the polymer membrane is between 1% and 45% with respect to the initial bubble point pore and/or the average pore size of the uncoated polymer membrane; that the metal and/or aluminum oxide is deposited until the porosity of the polymer membrane with the metal coating is reduced between 1% and 50%, in particular, 1% and 20% with respect to the initial bubble point pore and/or the average pore size, compared to the uncoated polymer membrane; and wherein the first side and a second side situated opposite the first side of the polymer membrane are directly areally coated with metal and/or aluminum oxide.

The deposition by means of magnetron sputtering enables the production over large surface areas of thin layers having a homogenous layer thickness and a complex layer structure. The basis of the magnetron deposition is a plasma discharge in an inert gas atmosphere, for example, argon, which is amplified by a static magnetic field (A. Anders, Handbook of Plasma Immersion Ion Implantation and Deposition, Wiley-VHC, 2004). The ions of the process gas are accelerated toward the cathode and upon impact, knock out atoms from the latter. Consequently, the cathode (target) must be made of the material that is to be precipitated. The atoms knocked out of the target then condense on the substrate to be coated and form a continuous thin layer. This layer can be selectively generated to a thickness of a few nanometers to several micrometers. In addition to round magnetrons, rectangular variants several meters in length are widely used, primarily for coating larger surfaces, for example, in architectural glass coating. In this way, it is possible to coat surfaces of membranes.

Atomic layer deposition—ALD, is a method for depositing atomically thin and conformal surface layers from the gas phase by means of a self-limiting surface reaction (S. M. George, Chem. Rev. 110, 2010, 111-130). Two-stage reaction processes between two reactants are frequently used. In this case, the first gaseous precursor is channeled into the process chamber and adsorbed on the surface. At the same time, this results in the self-limitation of the process, since only a monolayer of the precursor is able to adhere to the surface. The surplus residues are removed from the reaction chamber in a subsequent flushing step with an inert gas, frequently argon. The second precursor is then channeled into the reaction chamber and also adsorbed on the surface. At this point, a chemical reaction of the two adsorbed precursors occurs, resulting in the formation of a layer of the reaction product one monolayer in thickness. The gaseous reaction products are then again flushed from the reaction chamber with an inert gas. As a result of this four-stage process, the precursors react only on the surface and not in the gas phase, thereby forming very thin and homogenous layers. By repeating the steps, atomic layer after atomic layer thus defined may be applied to the surfaces accessible to the gases. The adsorption of the reaction products from the gas phase makes possible the very homogenous coating of complex structures having a high aspect ratio, and is therefore widely used in the modern semiconductor industry.

The advantage of this method, as recognized by the inventor, is that the porous passages, openings, and cavities of a polymer membrane can also be effectively coated, and thus, an inert and/or biocidic porous membrane can be produced. In this way, it is also possible to produce a membrane with a very large conductive surface for electroadsorption or electrofiltration.

To achieve the object of the invention with respect to the metal and/or aluminum-oxide coated polymer membrane and the production thereof, a polymer membrane (for example, polysulfone, polyethersulfone, polypropylene or polyvinylidene fluoride) is now provided with a thin layer of metal and/or aluminum oxide using the atomic layer deposition method. In the process, the retention time of the membrane in the process is selected low enough that the temperature remains below 200° C. and the original chemical structure of the polymer membrane is unaffected. By way of example, a polyethersulfone membrane with a microporous structure was provided with a 20 nm thin layer of aluminum. Porosity tests were conducted on this membrane. The following table shows the results of the porosity measurement of the membrane, in its original state and with a defined thick layer of 20 nm of aluminum.

TABLE 1

Pore sizes of a microporous polyethersulfone membrane in the original and with a 20 nm thick aluminum layer.

| | Polyethersulfone membrane | | |
| --- | --- | --- | --- |
| | 20 nm coating Al | Original | Difference % |
| Bubble point pore size (µm) | 0.51 | 0.56 | 8.5 |
| Average pore size (µm) | 0.41 | 0.43 | 6.1 |
| Smallest pore size (µm) | 0.37 | 0.39 | 5.5 |

It is apparent that the porosity of the membrane to below 10% is affected.

According to the method, to produce a polymer membrane coated with metal:
a. a polymer membrane is prepared
b. the polymer membrane is coated with metal using the ALD method, wherein, in particular, the temperature of the polymer membrane does not rise above 200° C.

In the process, the metal coating and/or the aluminum oxide is applied at least areally to a first side of the polymer membrane and/or at least to the surfaces accessible from one side to gases, until the layer thickness of the coating of metal and/or of aluminum oxide of the polymer membrane is between 1% and 45% with respect to the initial bubble point pore and/or the average pore size of the uncoated polymer membrane.

The coating is applied, in particular, porously and, in particular, directly.

"Directly" means that the coating is applied directly to the polymer membrane using ALD. Generally, for this purpose, a precursor is first applied and then the actual metal layer is applied. The precursor is particularly advantageously one containing an aluminum oxide, so that, upon subsequent deposition, the coating consists of metal and aluminum oxide. For many applications, however, a deposition of aluminum oxide is also sufficient.

An aluminum oxide-coated membrane may be used, for example, as a very resistant membrane. The coating is referred to as porous, not because it has of necessity a porous surface, but because it largely mirrors, and does not seal, the porous surface of the polymer membrane.

The surfaces accessible from one side to gas may also be the entire surfaces of the membrane. The pores may also be wholly or partly sealed beforehand, in order to reduce the surfaces accessible from one side to gas.

It is also possible to coat both sides so that the surfaces accessible from at least one of two sides of the polymer membrane to gas are coated. Thus, for example, a membrane coated on both sides may be produced, the inner region of which is not coated, since the pores were previously sealed.

The pores may subsequently be opened again.

Thus, a coated polymer membrane can be produced with only minimally reduced porosity and good conductivity at the same time. An inert and very resistant membrane is formed if the polymer membrane is coated not just on one side, but completely with metal and/or aluminum oxide according to the above method, and is thus encapsulated in metal and/or aluminum oxide, thus, also the surfaces of the porous passages, in particular, completely coated with metal and/or aluminum oxide.

Metal for the coating includes, in particular, copper, aluminum, silver, gold, nickel, platinum and/or tungsten or alloys containing copper, aluminum, silver, gold, nickel, platinum and/or tungsten.

Particularly preferred is a coating, which is inert and/or biocidic, in particular through the use of biocidemic and/or inert metals and/or aluminum oxide for coating. Biocidic coatings can be achieved, for example, by using silver in the coating. Inert coatings can be achieved, for example, by using tungsten for coating.

Polymer membranes include, for example, membranes made of polysulfone, polypropylene, polyethersulfone, polyethermide, polyacryl nitrile, polycarbonate, polyethylene terephthalate, polyvinylidene fluoride (PVDF) and/or polytetrafluoroethylene or those containing polysulfone, polypropylene, polyethersulfone, polyethermide, polyacryl nitrile, polycarbonate, polyethylene terephthalate, polyvinylidene fluoride (PVDF) and/or polytetrafluoroethylene.

Metal and/or aluminum oxide are particularly preferably deposited until the layer thickness of the metal and/or aluminum oxide coating of the polymer membrane is between 1% and 45% with respect to the initial bubble point pore and/or the average pore size of the uncoated polymer membrane.

With these values, it is possible to combine high stability and conductivity with high throughput and high porosity.

Metal and/or aluminum oxide is preferably deposited until the porosity of the polymer membrane with a metal coating is reduced between 1% and 50%, in particular, 1% and 20% with respect to the initial bubble point pore and/or the average pore size, compared to the uncoated polymer membrane. These values as well allow for the combination of high stability with good throughput and high porosity.

Metal and/or aluminum oxide is preferably deposited until the initial bubble point pore and/or the average pore size of the polymer membrane coated with metal and/or aluminum oxide is 0.01 µm to 10 µm. For this purpose, the polymer membrane is selected with an initial bubble point pore and/or average pore size of more than 0.01 µm to 10 µm.

The polymer membrane is advantageously porously and directly coated areally with metal and/or aluminum oxide on the first side and on a second side situated opposite the first side.

In this way, it is possible to create a membrane having two surfaces that are electrically conductive and insulated from one another by omitting the coating of the porous passages and the edges to the extent that no conductive connection between the two sides is formed. This can be achieved, for example, by sealing beforehand and subsequently opening the pores. If, on the other hand, the porous passages are also completely coated and, optionally, also the edges, a completely encapsulated and very resistant membrane is formed.

Metal and/or aluminum oxide is advantageously deposited until the thickness of the metal and/or aluminum oxide coating or the average thickness of the metal and/or aluminum oxide coating is at least 1 nm, in particular, at least 5 nm and a maximum of 50 nm. These values allow for a combination of high stability and, with at least 5 nm, good conductivity with good throughput and high porosity as well.

The pore size of the uncoated polymer membrane is advantageously selected between 0.01 µm and 15 µm, in particular, up to 10 µm. In this case, a sealing of the pores with metal may especially effectively be prevented.

Metal and/or aluminum oxide is advantageously deposited until the thickness of the metal and/or aluminum oxide coating of the pores within the membrane or the average thickness of the metal and/or aluminum coating of the pores within the membrane is at least 1 nm and a maximum of 50 nm.

The object is substantively achieved by a metal and/or aluminum coated polymer membrane having porous passages, wherein the metal and/or aluminum coated polymer membrane has an interior polymer membrane with porous passages and a metal and/or aluminum coating, characterized in that the polymer membrane is completely encapsulated by the metal and/or aluminum oxide coating, and that the metal and/or aluminum oxide coating has a thickness of 1 nm, in particular 5 nm, up to 50 nm.

The coating in this case is applied directly, in particular using ALD, to the polymer membrane. Thus, the coated polymer membrane is made up exclusively of the polymer membrane, used precursors or components thereof and the metal and/or aluminum oxide coating. Aluminum oxide, in particular, is used as a component of the precursor, thus, the membrane is made up of, in particular, a polymer membrane, aluminum oxide and metal. However, the membrane may also be made up exclusively of a polymer membrane, aluminum oxide.

With respect to the advantageous embodiment and the properties of the polymer membrane, the coating, and the pores, reference is made to the preceding explanations of the method, which may be advantageously implemented in a similar substantive manner.

Thus, with respect to the initial bubble point pore and/or the average pore size, the polymer membrane with the metal or aluminum oxide coating particularly advantageously has a porosity reduced between 1% and 50%, in particular, 1%, and 20% compared to the uncoated polymer membrane.

To achieve the object of the invention with respect to the electrofiltration or electrosorption, according to the method:
  a. a polymer membrane is provided with an areal and porous metal coating on at least a first side of the polymer membrane;
  b. a counter electrode is provided;
  c. the polymer membrane and the counter electrode are situated in a container for receiving liquid, with no conductive electrical connection existing between them;
  d. liquid is poured into the container;
  e. a voltage is applied between the metal coating of the polymer membrane and the counter electrode;
  f. the liquid is at least partially removed from the container or passes at least partially through the membrane;
  g. the polarity of the voltage is reversed.

If all the liquid is removed in step f, liquid is then advantageously added before or after step g, this is otherwise possible. The steps are carried out, in particular, in the order specified, wherein steps d and e may also occur in reverse order.

The polymer membrane with the metal coating is advantageously a metal coated membrane according to the invention or a membrane according to the invention coated with metal, as described above. These are particularly well suited, in particular when the porous passages are also coated with metal, since the electrically active surface are then significantly greater. Other metal coated polymer membranes may also be used, however.

With the use of polymer membranes having an inert coating, in particular, the metal coating is so adapted to the liquid, that it is inert in respect to contact with the latter.

The counter electrode is particularly advantageously formed either by an additional areal porous metal coating on a second side situated opposite the first side, wherein the areal metal coatings are insulated from one another by the polymer membrane, or by a permeable electrode, formed in particular by a metallic net, wherein an insulating and permeable spacer is interposed.

The porosity of the polymer membrane with the metal coating selected is advantageously reduced between 1% and 50%, in particular, 1% and 20% with respect to the initial bubble point pore and/or the average pore size, compared to the uncoated polymer membrane. This provides reliable conductivity with simultaneously greater porosity.

The polymer membrane is advantageously selected in such a way that the thickness of the metal coating is 1 nm, in particular, 5 nm to 50 nm and/or the pore size of the uncoated polymer membrane is, in particular, larger than 0.01 µm and, in particular, smaller than 15 µm. This provides reliable conductivity with simultaneously greater porosity.

Especially advantageously a reference electrode is provided for measuring purposes and the potential at the reference electrode is measured.

In addition to the polymer membrane with the metal coating, which is used according to the invention as an electrode, and a counter electrode, as well as optionally a reference electrode, at least one additional electrode is advantageously provided, in particular, at least one additional polymer membrane with a metal coating, to be provided, in particular, according to the invention as explained above, as an additional electrode. This additional electrode is also disposed in the container and electrically insulated by the polymer membrane with the metal coating and the counter electrode, in particular, in step c.

A voltage is applied, in particular, to the at least one additional electrode, which is selected so that the potential of the counter electrode falls between the potential of the polymer membrane with the metal coating and the at least one additional electrode. The counter electrode is disposed, in particular, in the container between the polymer membrane with the metal coating and the at least one additional electrode.

In this case, it may also be appropriate to use multiple reference electrodes and to arrange each between the electrodes and/or counter electrodes.

Tests for electrosorption were conducted on a polyethersulfone membrane. A laboratory filtration membrane having a diameter of d=47 mm with a 15 nm layer of aluminum by means of magnetron sputtering was provided for this purpose. A copper cable was adhered to the aluminum surface and provided with an insulating paint. The remaining cable was approximately 30 cm long and insulated. The membrane was introduced into a commercial vacuum filtration unit. Purified water was added to the supernatant and a platinum counter electrode was introduced into the supernatant.

Endotoxins were introduced into the supernatant, so that the supernatant exhibited an endotoxin concentration of 1,000 IU (endotoxin international units). Filtration was carried out without pressure. A filtration of the membrane was carried out in the original state with no coating and a filtration was carried out with a membrane with a coating of 15 nm. A voltage of +500 mV was applied to the coated membrane. The results are displayed in the following table.

|  | Concentration of endotoxin in IU/ml | | ml |
| --- | --- | --- | --- |
|  | Original | Collecting container | Sample volume |
| Filter with no coating | 1000 | 952.5 | 100 |
| Filter with coating at +500 mV | 1000 | 0.3 | 50 |

It is clearly apparent that endotoxins are almost completely adsorbed via the charged aluminum coating, so that the concentration is almost zero. The polymer membrane in the original state, but also the metal coated polymer membrane without voltage adsorbs little.

The layer thickness of the metal layer on the membrane affects the residual size of the pores. For example, in a microfiltration membrane having an average pore side of 0.1 μm, a layer thickness of 25 nm would result in a mathematical reduction of the pore size to approximately 0.05 μm, which from 40 nm would result in a reduction of the pore size to approximately 0.02 μm. This results in a significant reduction of porosity. Instead of applying a layer thickness of 40 nm in a microfiltration membrane, it is usually more expedient in this example to select an ultrafiltration membrane of 0.05 μm in pore size and to provide it with a layer thickness of 15 nm, which then mathematically also results in a pore size of 0.02 μm. A significantly higher porosity may be achieved in this way.

The object is substantively achieved by an electrosorption device and/or electrofiltration device containing a counter electrode and a polymer membrane with an areal and porous metal coating on at least one side of the polymer membrane and a contacting of the metal coating for applying a voltage opposite the counter electrode.

The device may also include a device for generating a voltage, which is arranged so that it is able to generate a potential between the metal coating of the polymer membrane and the counter electrode.

Counter electrode and polymer membrane with an areal and porous metal coating are, in particular, electrically insulated from one another.

For this purpose, the electrosorption device and/or electrofiltration device includes, in particular, a container for the arrangement or transit of fluid in which the polymer membrane and the counter electrode are arranged electrically insulated from one another.

The electrosorption device and/or electrofiltration device may include one or multiple reference electrodes.

It may also advantageously include at least one additional electrode, as described above with respect to the electrosorption method and/or electrofiltration method. The additional substantive features described with respect to this method may also be advantageously implemented in the electrosorption device and/or electrofiltration device.

The polymer membrane with the metal coating is advantageously a metal coated membrane according to the invention or a membrane according to the invention coated with metal as described above. These are particularly suitable, in particular, even if the porous passages are coated with metal, since the electrically active surface is significantly larger. Other metal coated polymer membranes may also be used, however.

The counter electrode is particularly advantageously either a wide, areal porous metal coating on a second side disposed opposite the first side or a permeable electrode, formed, in particular by a metallic net, between which an insulating and permeable spacer is interposed.

A merely exemplary electrofiltration device according to the invention is shown in FIG. 1. With this device, it is possible to carry out the electrofiltration method according to the invention.

The fluid is poured into the feed container and filtered through the membrane, formed by a metal coated polymer membrane, into the collecting container while a voltage is applied between the electrode formed by the membrane and the counter electrode. The frit is used to stabilize the membrane.

What is claimed:

1. An electrosorption device and/or electrofiltration device, comprising:
   a polymer membrane with a first area of a porous metal coating on a first side of the polymer membrane;
   a counter electrode;
   wherein the counter electrode is formed as a permeable electrode by a metallic net, and wherein the permeable electrode is permeable to gas or liquid;
   a DC power supply;
   wherein the first area of the porous metal coating and the counter electrode are electrically connected to the DC power supply; and
   an insulating and permeable spacer interposed between the permeable electrode and the polymer membrane wherein the permeable spacer is permeable to gas or liquid.

2. The electrosorption device and/or electrofiltration device according to claim 1, wherein the counter electrode is formed by an additional area of a porous metal coating on a second side of the polymer membrane, wherein the second side of the polymer member is situated opposite the first side of the polymer membrane, and wherein the first area of the porous metal coating and the additional area of the porous metal coating are insulated from one another by the polymer membrane.

3. The electrosorption device and/or electrofiltration device according to claim 1, wherein a thickness of the porous metal coating is from about 5 nm up to about 50 nm.

4. The electrosorption device and/or electrofiltration device according to claim 1, wherein a porosity of the polymer membrane with the porous metal coating is reduced between 1% and 50% with respect to an initial bubble point pore size or an average pore size, compared to the uncoated polymer membrane used to produce said polymer membrane with the porous metal coating.

5. The electrosorption device and/or electrofiltration device according to claim 4, wherein a pore size of the uncoated polymer membrane used to produce said polymer membrane with the porous metal coating is from about 0.01 μm up to about 15 μm.

6. The electrosorption device and/or electrofiltration device according to claim 1, wherein the porous metal coating is inert.

7. The electrosorption device and/or electrofiltration device according to claim 1, wherein the porous metal coating is biocidic.

8. The electrosorption device and/or electrofiltration device according to claim 1, further comprising an additional electrode.

* * * * *